US008472191B2

(12) United States Patent
Yamamoto et al.

(10) Patent No.: US 8,472,191 B2
(45) Date of Patent: Jun. 25, 2013

(54) IMAGE DISPLAYING APPARATUS, HOLDING MEMBER THEREOF, AND IMAGE DISPLAYING SYSTEM

(75) Inventors: Takeshi Yamamoto, Tokyo (JP); Kinya Kamiguchi, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 13/113,383

(22) Filed: May 23, 2011

(65) Prior Publication Data
US 2011/0310555 A1  Dec. 22, 2011

(30) Foreign Application Priority Data

Jun. 17, 2010  (JP) ................................. 2010-138323

(51) Int. Cl.
*H05K 7/20* (2006.01)
*G06F 9/00* (2006.01)

(52) U.S. Cl.
USPC .............. 361/704; 361/679.06; 361/679.21; 361/679.54; 361/707; 361/710; 165/80.2; 165/80.3; 165/104.33; 165/185; 349/58; 349/60; 349/62; 349/72; 349/479; 349/150; 349/161; 313/46; 313/110; 345/39; 345/43; 345/44; 345/46; 345/55; 248/201; 248/122.1; 248/276.1; 248/279.1; 248/371; 248/284.1; 248/286.1; 248/917; 248/921

(58) Field of Classification Search
USPC ............ 361/679.01, 679.06, 679.21, 679.27, 361/679.46, 679.54, 688, 690–697, 704–715, 361/719–724, 831; 165/80.2, 80.3, 104.33, 165/121–126, 185; 174/15.1, 16.3, 252, 50, 174/50.52, 520; 312/223.2, 223.3, 7.2, 265.5, 312/265.6; 349/40, 58, 60–72, 111–113, 349/148–161; D14/125–129, 374; 345/39, 345/43, 44, 46, 55, 905; 313/46, 110, 27, 313/494, 634
See application file for complete search history.

(56) References Cited

U.S. PATENT DOCUMENTS

| 6,188,378 | B1 | 2/2001 | Yamamoto et al. | |
|---|---|---|---|---|
| 6,348,910 | B1 | 2/2002 | Yamamoto et al. | |
| 6,711,014 | B2 * | 3/2004 | Anzai et al. | 361/679.48 |
| 7,164,586 | B2 * | 1/2007 | Lin | 361/714 |
| 7,457,120 | B2 * | 11/2008 | Bae et al. | 361/704 |

(Continued)

FOREIGN PATENT DOCUMENTS

| JP | 2000223875 A | * | 8/2000 |
|---|---|---|---|
| JP | 2001-337612 A | | 12/2001 |
| JP | 02005274885 A | * | 10/2005 |
| JP | 2010-140194 A | | 6/2010 |

*Primary Examiner* — Michail V Datskovskiy
(74) *Attorney, Agent, or Firm* — Fitzpatrick, Cella, Harper & Scinto

(57) ABSTRACT

An image displaying apparatus, which is excellent in heat radiation efficiency and has an excellent back design, includes a display panel for displaying an image; a heat generating member provided on a back side of the display panel; and a cabinet for covering the display panel and the heat generating member at least from the back side of the display panel. In the cabinet, an aperture is provided at a position facing the heat generating member, and an opening/closing unit enables switching between closing and opening of the aperture. In a state that the aperture is opened by the opening/closing unit and one part of a heat-transfer member is positioned on a side of the cabinet opposite to the display panel, the other part of the heat-transfer member extends through the aperture so that the heat-transfer member can thermally be connected to the heat generating member.

14 Claims, 7 Drawing Sheets

U.S. PATENT DOCUMENTS

| | | |
|---|---|---|
| 7,529,082 B2 * | 5/2009 | Maruta ............... 312/7.2 |
| 7,580,248 B2 * | 8/2009 | Ogawa et al. ............ 361/679.21 |
| 7,593,226 B2 * | 9/2009 | Yamanaka ............... 361/695 |
| 7,619,354 B2 | 11/2009 | Kamiguchi et al. |
| 7,673,837 B2 * | 3/2010 | Park ............... 248/201 |
| 7,768,775 B2 * | 8/2010 | Kim ............... 361/679.27 |
| 7,817,221 B2 | 10/2010 | Kamiguchi |
| 7,903,418 B2 * | 3/2011 | Tracy et al. ............... 361/714 |
| 7,956,524 B2 | 6/2011 | Yamamoto |
| 7,974,083 B2 | 7/2011 | Kamiguchi |
| 8,065,887 B2 * | 11/2011 | Ogorevc ............... 62/259.2 |
| 8,279,359 B2 * | 10/2012 | Tanaka et al. ............... 348/836 |
| 8,320,119 B2 * | 11/2012 | Isoshima et al. ............ 361/679.47 |
| 8,351,194 B2 * | 1/2013 | Ku et al. ............ 361/679.21 |
| 2010/0007265 A1 | 1/2010 | Kamiguchi et al. |
| 2010/0008044 A1 * | 1/2010 | Ogiro et al. ............... 361/704 |
| 2010/0265662 A1 * | 10/2010 | Tracy et al. ............... 361/714 |
| 2010/0288524 A1 | 11/2010 | Tagawa et al. |
| 2010/0289401 A1 | 11/2010 | Ohtomo et al. |
| 2011/0134346 A1 * | 6/2011 | Hayashi et al. ............... 348/790 |

* cited by examiner

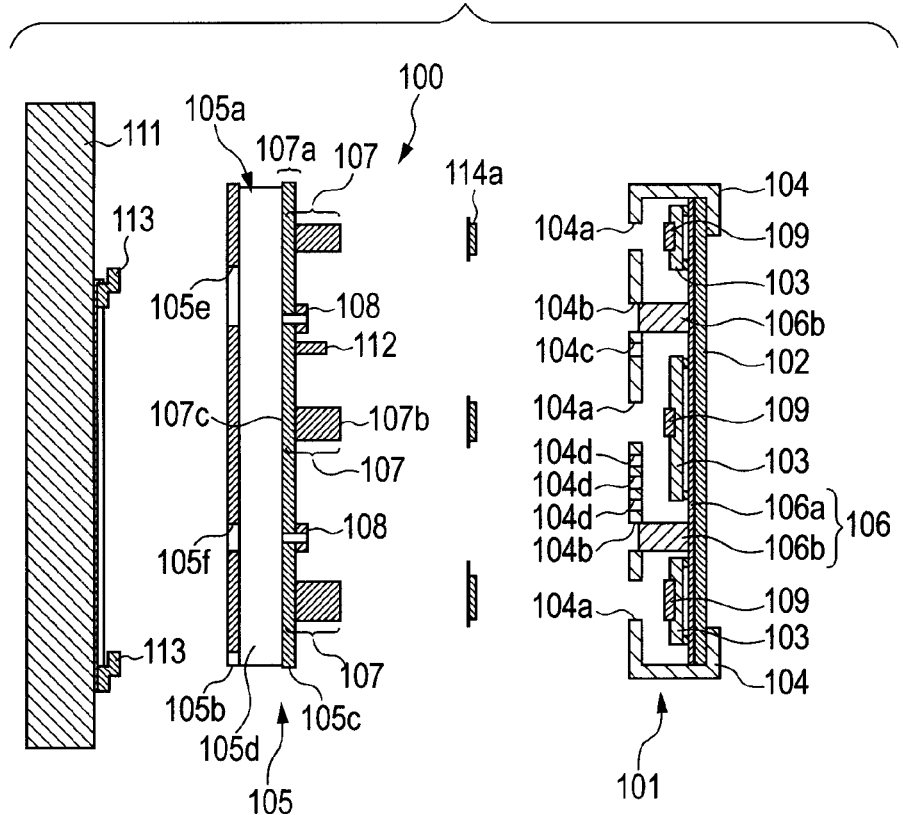
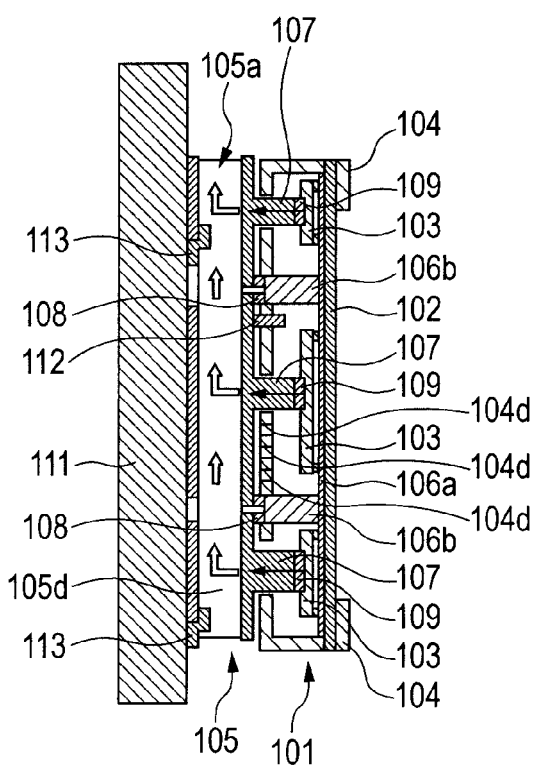
FIG. 1A
FIG. 1B

IMAGE DISPLAYING APPARATUS, HOLDING MEMBER THEREOF, AND IMAGE DISPLAYING SYSTEM

BACKGROUND OF THE INVENTION

1. Field of the Invention

The present invention relates to an image displaying apparatus, a holding member thereof, and an image displaying system, and, more particularly, to a holding constitution of the image displaying apparatus.

2. Description of the Related Art

In recent years, a flat image displaying apparatus having a display panel such as an LCD (liquid crystal display), PDP (plasma display panel), an FED (field emission display), an OLED (organic light emitting display) or the like has been developed. These image displaying apparatuses are made further thinner in order to improve superiority in design. However, as the image displaying apparatus is made thinner, a distance between a display panel being a heat generating part and an electric circuit substrate on which an image processing IC or the like also being a heat generating part is mounted becomes closer, whereby a heat generating density of the image displaying apparatus tends to increase entirely. Also, a heat generating amount itself tends to increase as luminance and image quality of the display panel increase.

As a heat radiation unit for the flat image displaying apparatus, a constitution disclosed in Japanese Patent Application Laid-Open No. 2001-337612 that a large number of heat radiation holes are provided on the back of a cabinet is widely known. Also, as another heat radiation unit, a constitution that a heat-transfer member is provided between the back of the cabinet and an electric circuit substrate is known (Japanese Patent Application Laid-Open No. 2001-337612). According to this constitution, heat generated in the electric circuit substrate can be transferred to the cabinet through the heat-transfer member, and then radiated from the cabinet.

Incidentally, the flat image displaying apparatus like this might be provided in a wall-hanging method. In such a case, it is required to install the image displaying apparatus as much as possible closer to the wall so that the image displaying apparatus is viewed more thinly as a whole. However, when the image displaying apparatus is installed close to the wall, heat radiation performance on the back of the cabinet deteriorates, whereby a temperature in the cabinet easily increases. Here, when the temperature in the cabinet increases, various problems such as thermal runaway due to heat, reduction of an apparatus lifetime, occurrence of image quality spots due to temperature spots of the display panel, damage of the display panel due to thermal stress, and the like occur. Incidentally, heat generated in a light source or the like of a liquid crystal displaying apparatus can be radiated with comparative ease. However, since a heat generation member mounted on the electric circuit substrate is often disposed at the upper portion of the cabinet, the heat generation member is easily exposed to higher temperature within the cabinet. When the heat radiation constitution is designed in consideration of the wall-hanging method in which the space at the back of the cabinet is small and thus heat radiation efficiency is low, the heat radiation constitution of which the performance exceeds the performance necessary in a general self-standing constitution is required, whereby the weights and the costs of the image displaying apparatus increase.

By the way, as a new method of installing the flat image displaying apparatus, a method in which a stand is used is known. More specifically, there are proposed various installing methods in which the flat image displaying apparatus is laid out by a wall, on a desk, or at the center of a room, by using a desk stand or a floor stand. Consequently, in order to cope with these installing methods, it is required to develop a layout-free image displaying apparatus which is flat and of which the back design is beautiful. To satisfy such requirement, the back heat radiation constitution has to be excellent in design. Conventionally, since it is assumed that the image displaying apparatus is viewed only from the front side (display surface side), the design on the back of the cabinet is not considered. For this reason, in the conventional image displaying apparatus which has the numerous heat radiation holes on the back thereof, it is impossible to achieve a design which corresponds to the layout-free image displaying apparatus.

The present invention aims to provide an image displaying apparatus which is excellent in heat radiation efficiency and has an excellent back design, a holding member of the relevant image displaying apparatus, and an image displaying system to which the relevant image displaying apparatus is applicable.

SUMMARY OF THE INVENTION

An image displaying apparatus according to the present invention comprises: a display panel configured to display an image on a display surface; a heat generating member provided on a back side being an opposite side of the display surface of the display panel; a cabinet configured to cover the display panel and the heat generating member at least from the back side of the display panel, wherein, on the cabinet, an aperture is provided at a position facing the heat generating member; and an opening/closing unit configured to enable to switch between closing and opening of the aperture. In a state that the aperture is opened by the opening/closing unit and one part of a heat-transfer member is positioned on a side of the cabinet opposite to the display panel, the other part of the heat-transfer member extends through the aperture so that the heat-transfer member can thermally be connected to the heat generating member.

According to such a constitution as above, the heat can directly be drawn from the heat generating member by the other part of the heat-transfer member, and the heat drawn from the heat generating member can be radiated outwardly from the cabinet by the one part of the heat-transfer member. Namely, since the heat can directly be drawn from the heat generating source and directly be radiated outwardly from the cabinet without the cabinet, the image displaying apparatus according to the present invention has high heat radiation efficiency. Moreover, the aperture which can accept the heat-transfer member has the opening/closing unit which can switch between closing and opening of the aperture. Consequently, in a case where, in various installing conditions, the image displaying apparatus is installed under a satisfactory heat radiation condition, the aperture can be closed. As a result, since the aperture becomes inconspicuous, the design of the back of the image displaying apparatus improves.

Incidentally, it should be noted that "a side of the cabinet opposite to the display panel" means a region which is positioned outside the cabinet and also a region which is positioned on the side opposite to the display surface across the cabinet.

An image displaying system according to the present invention comprises an image displaying apparatus and a holding member which is fixed to the image displaying apparatus. Here, the image displaying apparatus comprises a display panel configured to display an image on a display surface; a heat generating member provided on a back side being an opposite side of the display surface of the display panel; and a cabinet configured to cover the display panel and the heat generating member at least from the back side of the display panel, wherein, on the cabinet, an aperture is provided at a position facing the heat generating member. Further, the holding member comprises: a first portion fixed to a wall; and a second portion made by a heat-transfer member, wherein an airflow path through which air can flow is formed between the first portion and the second portion. The second portion of the holding member is fixed to the image displaying apparatus. In a state that one part of the heat-transfer member is positioned on a side of the cabinet opposite to the display panel, the other part of the heat-transfer member extends through the aperture, and the heat-transfer member is thermally connected to the heat generating member.

As described above, according to the present invention, it is possible to provide the image displaying apparatus which is excellent in heat radiation efficiency and has an excellent back design, the holding member of the relevant image displaying apparatus, and the image displaying system to which the relevant image displaying apparatus is applicable.

Further features of the present invention will become apparent from the following description of exemplary embodiments with reference to the attached drawings.

BRIEF DESCRIPTION OF THE DRAWINGS

FIGS. 1A and 1B are sectional side views illustrating an image displaying apparatus and a holding constitution thereof according to a first embodiment of the present invention.

DESCRIPTION OF THE EMBODIMENTS

First Embodiment

Figure 2A:
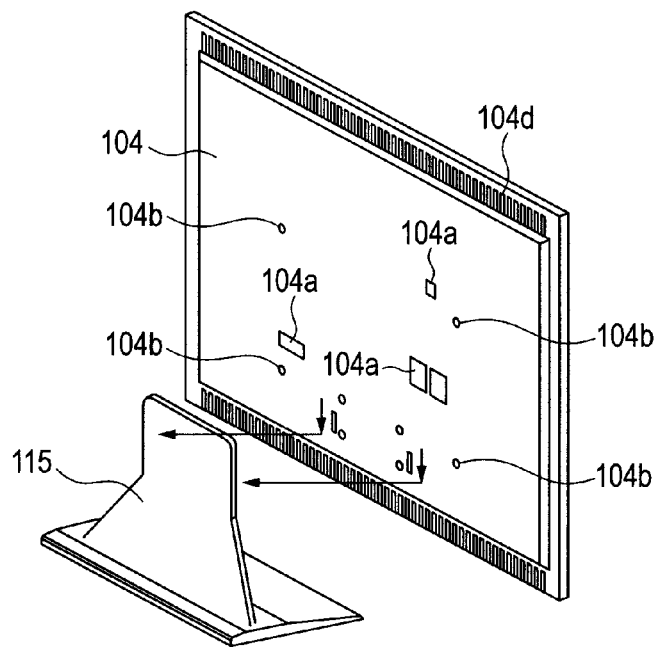
FIGS. 2A and 2B are perspective views illustrating a part of the image displaying apparatus illustrated in FIGS. 1A and 1B and a stand thereof.

Hereinafter, an image displaying system according to a first embodiment of the present invention will be described with reference to the attached drawings. Here, it should be noted that an image displaying system 100 includes an image displaying apparatus 101 and a holding member 105 thereof. The image displaying apparatus 101 and the holding member 105 can be provided separately, and the image displaying system 100 can be constituted by properly combining the image displaying apparatus 101 and the holding member 105, FIGS. 1A and 1B are sectional side views illustrating the image displaying apparatus and the holding constitution thereof. More specifically, FIG. 1A is an exploded view of the image displaying apparatus and the holding constitution, and FIG. 1B is an assembly view of them (a sectional view indicating a wall-mounted state of them). Here, it should be noted that the wall-mounted state is the state that the image displaying apparatus is mounted and fixed to an interior or exterior wall by means of the holding member.

The image displaying apparatus 101 has a display panel 102 for displaying an image on a display surface. The display panel 102 is any type of display panel used for a flat display such as an LCD, a PDP, an FED, an OLED or the like, and any display panel is available regardless of its type. A chassis 106 is provided on a back side (a side opposite to a display surface) of the display panel 102. The chassis 106 has a panel fixing portion 106a and a connecting portion 106b. The panel fixing portion 106a, which is, for example, a metal plate, is fixed to a back (a surface on the side opposite to the display surface) of the display panel 102 by adhesive or the like. The connecting portion 106b is fixed to the panel fixing portion 106a. The connecting portion 106b is coupled to a holding member 105 or a stand 135 in case of setting the display panel in a wall-hanging method or with use of the stand, and the holding member 105 or the stand 135 supports the display panel 102 through the chassis 106.

Circuit boards 103 to be used for driving the display panel 102 are fixed to the panel fixing portion 106a by screws (not illustrated). Heat generating members 109 such as, for example, an image processing IC which constitutes an image processing circuit, a driving IC which constitutes a driver circuit and the like are mounted on each of the circuit boards 103. These heat generating members 109 are provided on a back side of the display panel 102.

A cabinet 104 is fixed to the chassis 106 by screws (not illustrated). The cabinet 104 covers the circuit boards 103 on which the heat generating members 109 are mounted and the display panel 102 at least from a back side of the display panel 102. For this reason, the heat generating members 109 position between the cabinet 104 and the display panel 102. The cabinet 104 may further cover a part of the display surface side of the display panel 102.

The cabinet 104 has apertures 104a provided on positions facing to the heat generating members 109. An aperture area of the apertures 104a is set to become almost the same as that of the heat generating members 109 (IC). The width of a general IC package is in a range from 0.5 cm to 5 cm. The image displaying apparatus 101 has opening/closing units which enable to perform the opening and closing of the apertures 104a. As the opening/closing units, various units can be utilized. In the present embodiment, as the opening/closing units, caps 114a which can be fixed to or removed from the apertures 104a are used. The fixing mentioned here means to close the apertures 104a and the removing mentioned here means to open the apertures 104a. The caps 114a may be detachable for the cabinet 104 or may be locked onto the cabinet 104.

The cabinet 104 also has apertures 104b, an aperture 104c and apertures 104d. The apertures 104b and the aperture 104c are used when the holding member 105 is mounted to the cabinet 104. The apertures 104d are formed to have such an aperture area, which is smaller than that of the apertures 104a. The apertures 104d are air communication holes provided for the purpose of releasing the high-temperature air inside the cabinet 104 to the outside of the cabinet 104. Therefore, the apertures 104d are not required to be such the large apertures if the conductance capable of releasing the high-temperature air is ensured. A fan used for forcedly evacuating the high-temperature air through the apertures 104d may be provided at the inside of the cabinet 104. Alternatively, design of a back of the cabinet 104 may be improved by not providing the apertures 104d in some cases.

The holding member 105 formed in a plate-like member has a first portion 105b which constitutes one surface of the holding member 105 and a second portion 105c which constitutes another surface of the holding member 105. The holding member 105 is formed in such the structure, where a first plate-like member which constitutes the first portion 105b is faced to a second plate-like member which constitutes the second portion 105c and these two members are mutually fixed.

Since the first portion 105b and the second portion 105c function as the holding member, these portions are made from the material which is excellent in rigidity. Additionally, at least the second portion 105c is made from the material excellent in heat conductivity. Therefore, the second portion 105c of the holding member 105 functions as at least a part of a heat-transfer member. It should be noted that "heat-transfer member" is used as the collective term which means a primary member contributing to heat radiation. More specifically, the heat-transfer member is such the member of integrating a base portion 107a, projections 107 and a radiation fin 105d. According to a fact that the first portion 105b is also made from the material excellent in heat conductivity, it is preferable that the first portion 105b is also used as the heat-transfer member. In this case, the whole of the holding member 105 functions as the heat-transfer member. More specifically, the holding member 105 is fabricated from the metal (includes alloy), and preferably, aluminum, copper, aluminum alloy or copper alloy is used. It is most preferable that the aluminum alloy is casted by a process of die-casting.

The first portion 105b has an aperture 105e. Fixing members 113 are previously provided on a wall 111 to which the displaying apparatus is hung, and the peripheral part of the aperture 105e of the first portion 105b is hooked by the one fixing member 113. Similarly, the edge of the first portion 105b is also hooked by the other fixing member 113. In this manner, the first portion 105b of the holding member 105 is fixed to the wall 111.

An airflow path 105a, through which air can flow, is formed between the first portion 105b and the second portion 105c. A first portion 105b side (wall 111 side) of the second portion 105c is exposed at the airflow path 105a. As a result, the second portion 105c has a heat radiation constitution. In addition, a fan for forcibly flowing air of the airflow path 105a may be placed.

The second portion 105c has the plate-like extending base portion 107a, connecting portions 108 used for fixing the image displaying apparatus 101 to the holding member 105, the projections 107 thermally connected to the heat generating members 109, a positioning portion 112 and the radiation fin 105d. The projections 107 project from the base portion 107a of the second portion 105c toward the side opposite to the first portion 105b. The projections 107 are constituted by the material excellent in the heat conductivity fixed to the base portion 107a of the second portion 105c with a closely-attached state or integrally formed with the base portion 107a of the second portion 105c. Therefore, each of the projections 107 functions as a part of the heat-transfer member. The radiation fin 105d, which positions in the airflow path 105a, are provided at the wall 111 side of the second portion 105c. A surface area of the second portion 105c for the airflow path 105a is increased by the radiation fin 105d. The radiation fin 105d may be integrally formed with the base portion 107a or may be joined together with the base portion 107a by a welding process or the like. It is preferable that the radiation fin 105d is thermally contacted with the first portion 105b.

The aperture 104a can take in the projection 107 such that the projection 107 extends through the aperture 104a and one end 107b of the second portion 105c is connected to the heat generating member 109 with a state that other end 107c of the second portion 105c positions at the outside of the cabinet 104. Here, the one end 107b of the second portion 105c is the tip of the projection 107 and the other end 107c is a part of the base portion 107a facing the airflow path 105a. It is sufficient that the projection 107 is thermally connected to the heat generating member 109 by the one end 107b. Therefore, the projection 107 may be directly contacted to the heat generating member 109 or may be connected to the heat generating member 109 through a heat-conductive elastic body (gel or gum) or grease.

Consequently, the heat generated by the heat generating member 109 is transferred to a surface of the airflow path 105a side of the second portion 105c through the projection 107. And, the heat is efficiently radiated passing through the airflow path 105a from the radiation fin 105d of the second portion 105c. At this time, the aperture 104d takes a role of the auxiliary heat radiation function.

In the present embodiment, the plural projections 107, the apertures 104a and the heat generating members 109 are actually provided, and the respective projections 107, the apertures 104a and the heat generating members 109 mutually keep the relationship between them. Locating positions of the apertures 104a and the projections 107 are properly set. A distance between the aperture 104a and the heat generating member 109 is properly set such that the projection 107 can be connected to the heat generating member 109. Typically, the distance between the aperture 104a and the heat generating member 109 is set to become less than the height of the projection 107. A shape of the aperture 104a is properly set to become such a shape, through which the projection 107 can extend. Typically, the shape of the aperture 104a is such a shape obtained by similarly extending a cross-section shape of the projection 107. In addition, it is preferable that a contact area of the projection 107 and a heat generating region of the heat generating member 109 is a large area and preferable that a cross-sectional area of the projection 107 is larger than an area of the heat generating region of the heat generating member 109. It is desirable that each of the projections 107 has the specific shape and positional relation of every product number of the image displaying apparatus 101 in accordance with the shape and positional relation of each of the heat generating members 109. Consequently, a case that the image displaying apparatus 101 is combined with the erroneous projections 107 and the heat radiation capability is deteriorated because thermal contact failure can be prevented.

The positioning portion 112, which is inserted in the aperture 104c of the cabinet 104, determines a position of the holding member 105 for the image displaying apparatus 101. By providing two positioning members 112, the positioning of the rotation direction rotating around an axis corresponding to a normal line of a display surface of the image displaying apparatus 101 also can be realized. Although the positioning members 112 may be made from the same material as that of the projections 107, the high heat conductivity is not required to the positioning members 109 different from a case of the projections 107.

In case of setting the image displaying apparatus in a wall-hanging method, the caps 114a are initially removed from the apertures 104a of the image displaying apparatus 101. Next, the projections 107 are extended through the apertures 104a and the positioning portion 112 is extended through the aperture 104c. With this state, a screw (not illustrated) is inserted from a back side of the holding member 105 through an aperture 105f in the connecting portion 108, and the screw is fixed to the connecting portion 106b through the aperture 104b. In this manner, the holding member 105 is fixed to the image displaying apparatus 101 by the connecting portion 108 of the second portion 105c. At this time, the projections 107 extend through the apertures 104a of the cabinet 104, and one end (tip) 107b of each of the projections is thermally connected to each of the heat generating members 109. Thereafter, the holding member 105, to which the image displaying apparatus 101 was fixed, is fixed to the fixing members 113 previously fixed to the wall 111.

Figure 2B:
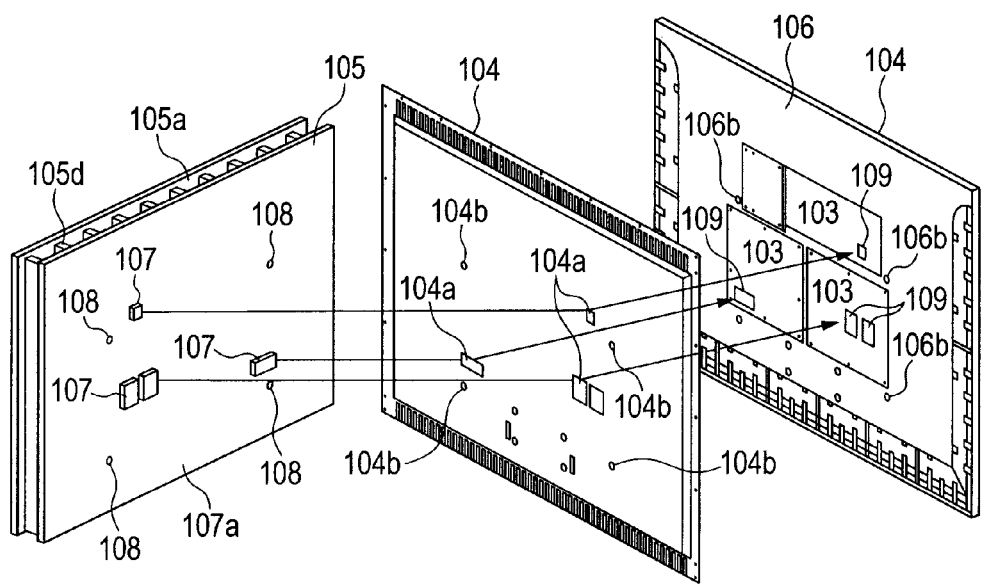

FIG. 2A indicates a setting mode of the image displaying apparatus when using a stand, and FIG. 2B indicates a setting modes of the image displaying apparatus when using a wall-hanging method. In case of using the image displaying apparatus with a stand mode, the caps 114a are inserted in the apertures 104a provided at a back of the cabinet 104. Consequently, the apertures 104a are closed, and the incorrect insertion of foreign substances or the invasion of dust from the apertures 104a can be prevented. It is preferable that caps (not illustrated) are also inserted in the apertures 104b and the aperture 104c. Consequently, not only a design of a back of the cabinet 104 is improved but also the incorrect insertion of foreign substances or the invasion of dust from the apertures 104a, the apertures 104b and the aperture 104c can be prevented. In addition, when using the image displaying apparatus with the stand mode, the holding member 105 can be removed, therefore, a flat and light-weight image displaying apparatus can be realized. Since the holding member 105 is not necessary in case of using the image displaying apparatus with only the stand mode, it is leading to the cost reduction of an image displaying system. On the other hand, when setting the image displaying apparatus in a wall-hanging method, since the heat generated from the heat generating members 109 is directly transmitted to the outside of the cabinet 104 by the heat-transfer members (projections) 107, an excellent heat radiation efficiency can be easily secured even if a space between the wall and a back of the cabinet is narrow.

Figure 3:
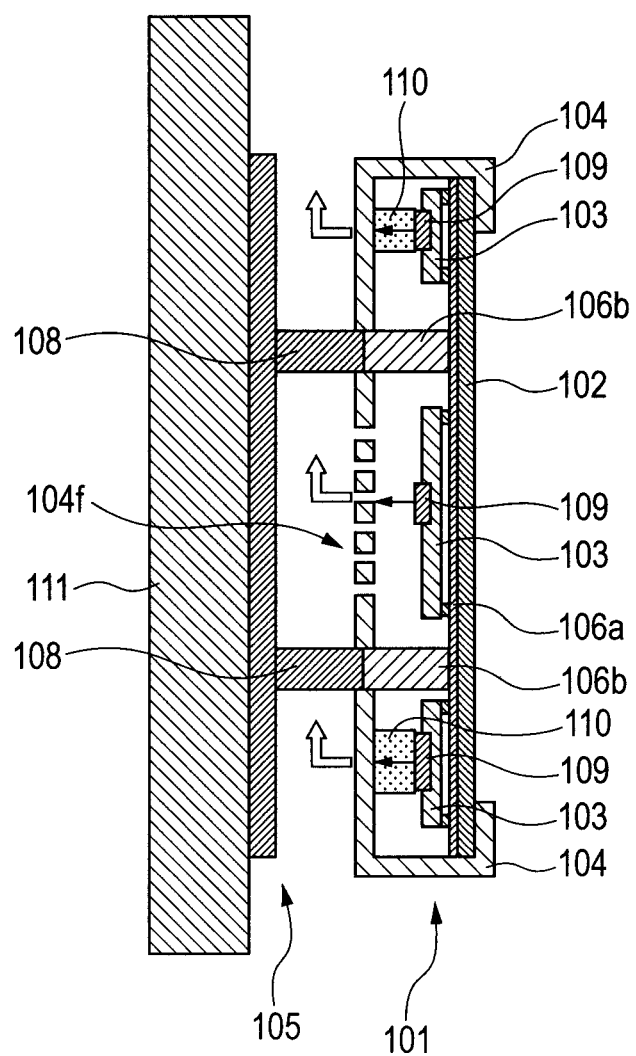
FIG. 3 is a sectional side view illustrating an image displaying apparatus and a holding constitution thereof in a comparative example.

The relation between a distance of a back space and the temperature of the heat generating member 109 was obtained by performing calculation. FIG. 3 indicates a comparative example of not having the holding member 105 of the double-plate constitution and the heat-transfer members 107. Heat radiation holes 104f of which a diameter is 5 mm are formed at a back of the cabinet 104 by a punching process. An aperture ratio of a back of the cabinet is about 20%. In the comparative example, the heat generated from the heat generating members 109 is transmitted to the cabinet 104 through heat conductive members 110, and the heat is radiated by the heat transfer functioned from the cabinet 104 and the heat radiation holes 104f. Therefore, if the distance of a back space between the cabinet 104 and the wall 111 is short, the heat radiation efficiency is deteriorated.

Figure 4:
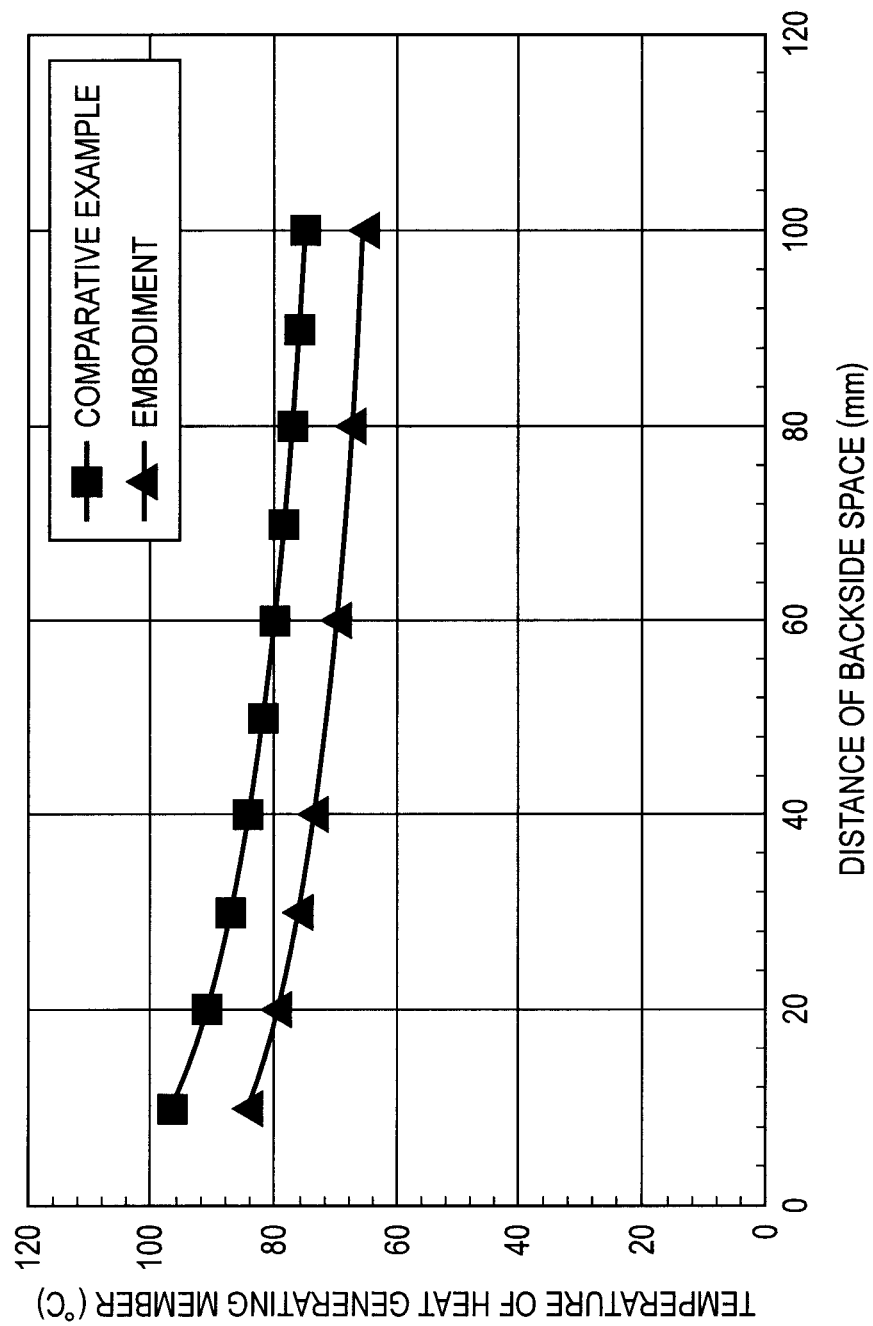
FIG. 4 is a graph indicating a relationship between distances of a back space and temperatures of a heat generating member.

FIG. 4 indicates the relation between the distance of a back space and the temperature of the heat generating member 109. The room temperature is set to become 25° C. The comparative example is the above-mentioned constitution illustrated in FIG. 3, and an embodiment is the above-mentioned first embodiment. The heat radiation efficiency increases by using the holding member 105 of the double-plate constitution and the heat-transfer members 107, and the more heat quantity can be released into the air. Therefore, in the present embodiment, the temperature of the heat generating member 109 decreased by about 10 to 15 degrees with the same distance of a back space as compared to the comparative example. In the present embodiment, since the certified operating temperature of the heat generating member 109 is 85° C., a back space having a distance of 40 mm is required in the comparative example in order to secure the reliability. For this fact, it is sufficient that a back space having a distance of 20 mm is secured in the present embodiment. Consequently, an image displaying apparatus can be set closer to the wall while maintaining the reliability for an image quality spot caused by a temperature spot of the panel or the damage of the display panel due to the thermal stress.

Second Embodiment

As for an image displaying apparatus 101 according to the second embodiment, the constitution of opening/closing units is different from that of the first embodiment but the constitution other than the opening/closing units is similar to that of the first embodiment. When referring to FIG. 5, the opening/closing units are door members 114b provided at the apertures 104a. The door members 114b are provided at the inside of the cabinet 104. The door members 114b have the elastic restoring force for acting to close the apertures 104a. The elastic resorting force may be given by any method. For example, hinges (not illustrated) are provided on the periphery of each of the apertures 104a, and the apertures 104a can be closed by the elastic force kept by the door members 114b themselves or the elastic force of springs (not illustrated).

Figure 5:
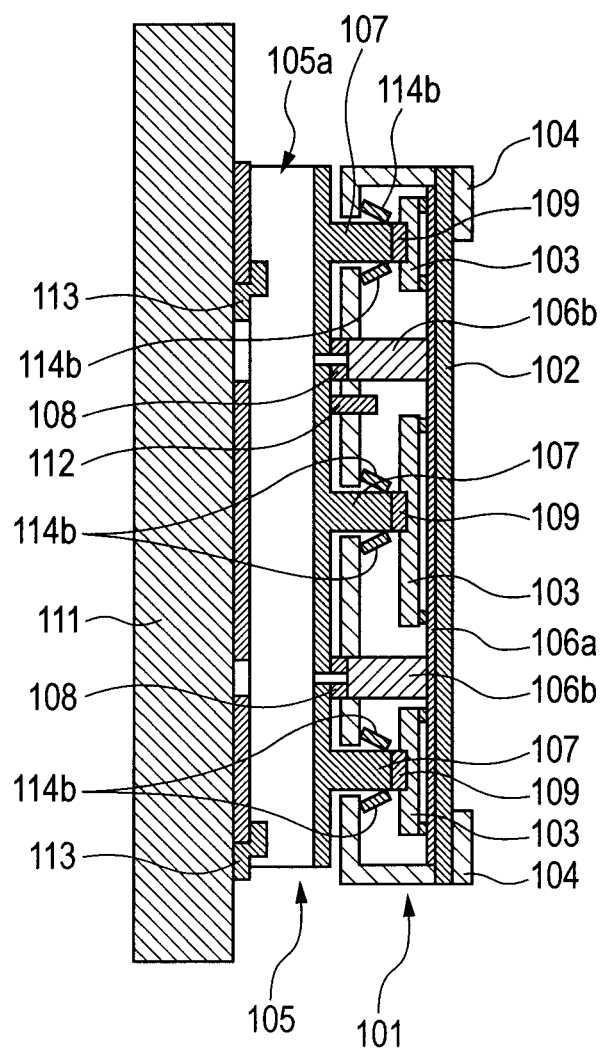
FIG. 5 is a sectional side view illustrating an image displaying apparatus and a holding constitution thereof according to a second embodiment.

In case of setting the image displaying apparatus 101 by using a desk stand or a floor stand, the door members 114b are closed by the elastic restoring force. As illustrated in FIG. 5, in case of setting the image displaying apparatus 101 in a wall-hanging method, the above-mentioned holding member 105 is mounted to the image displaying apparatus 101. When the door members 114b are pressed by the heat-transfer members 107 from the outside of the cabinet 104, the door members 114b rotate toward the inside of the cabinet 104, and the apertures 104a open and then the heat-transfer members 107 extend through the apertures 104a.

As compared with the first embodiment, a trouble of fixing or removing the caps 114a can be saved. In addition, a state of forgetting to remove or fix the caps 114a can be prevented. Furthermore, a state of losing the caps 114a tend to be easily occurred when the caps 114a are detachable for the cabinet 104 can be also prevented.

Third Embodiment

Figure 6B:
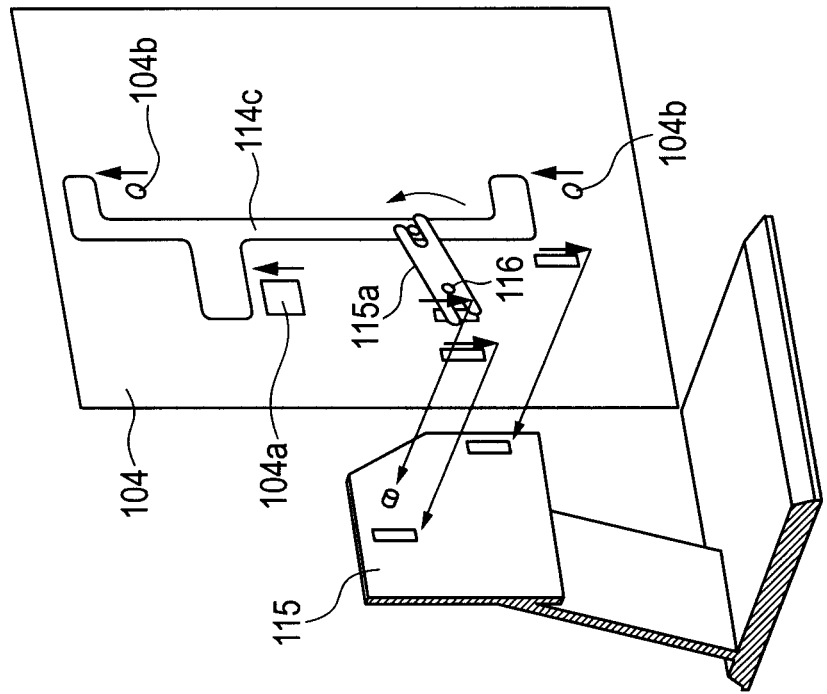
FIGS. 6A and 6B are perspective views illustrating a part of an image displaying apparatus and a stand thereof according to a third embodiment.
Figure 6A:
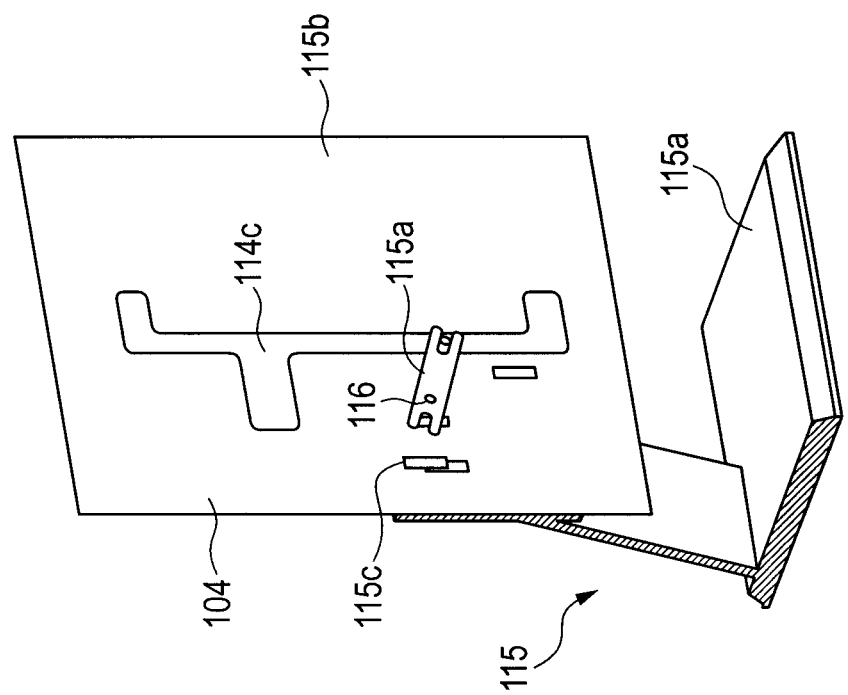

As for an image displaying apparatus 101 according to the third embodiment, the constitution of opening/closing units is different from that of the first embodiment but the constitution other than the opening/closing units is similar to that of the first embodiment. When referring to FIG. 6B, the opening/closing unit, which is provided at the inside surface of the cabinet 104, is a plate 114c which can slide along the inside surface of the cabinet 104. FIG. 6A is a perspective view illustrating a state that an image displaying apparatus is mounted to a stand, and FIG. 6B is an exploded perspective view of the image displaying apparatus and the stand, and only the cabinet is illustrated as the image displaying apparatus. These views indicate half models (the stand and the image displaying apparatus are longitudinally cut off at central portions of them and only the one sides of them are illustrated) of the stand and the image displaying apparatus.

An arm 115a is provided at the inside surface of the cabinet 104. The arm 115a, which is coupled to a fulcrum 116, can rotate around the fulcrum 116. The one end of the arm 115a is coupled to the plate 114c, which is made to be slid by an operation that the arm 115a rotates around the fulcrum 116. The apertures 104a, 104b and 104c which are similar to those of the first embodiment are provided at the cabinet 104 (only the apertures 104a and 104b are illustrated). The plate 114c can slide along the inside surface of the cabinet 104 between a first position (FIG. 6A) where the apertures 104a, 104b and 104c are closed and a second position (FIG. 6B) where the apertures 104a, 104b and 104c are opened by an operation that the arm 115a rotates around the fulcrum 116.

A stand 115 has the arm (foot portion) 115a, which can be set on a horizontal surface such as a floor, a table or the like, and a mounting portion 115b to which the image displaying apparatus is mounted. In case of setting the image displaying apparatus by using the stand, the stand 115 is fixed to the cabinet 104 of the image displaying apparatus 101 by sliding the stand 115. When the stand 115 is slid, the plate 114c is directly or indirectly pressed by the stand 115, and the apertures 104a, 104b and 104c are closed (first position). On the other hand, in case of setting the image displaying apparatus in a wall-hanging method, the plate 114c is slid to the second position, and the apertures 104a, 104b and 104c are opened, thereby enabling the heat-transfer members 107 to extend through the apertures 104a.

The arm 115a enables the plate 114c to easily perform a slide movement in a case that it is difficult to directly open and close the plate 114c constitutionally. Therefore, the arm 115a can be also excluded in some cases Even if the plate 114c is in the second position, the plate 114c automatically moves to the first position when the cabinet is fixed to the stand 115 by a convex portion 115c provided at the stand 115 illustrated in FIGS. 6A and 6B.

Since an opening/closing mechanism of the caps can be formed in a flat structure by using a sliding plate 114c, thickness of the whole of the image displaying apparatus can be suppressed. In addition, since a link mechanism by the arm 115a is utilized, the moving direction of the plate 114c can be freely determined and the moving width can be easily adjusted, thereby improving a degree of freedom of the design. In case of setting the image displaying apparatus by using the stand, since the apertures 104a, 104b and 104c are closed by the plate 114c, the entering of the foreign substances or dust can be also prevented.

Fourth Embodiment

Figure 7:
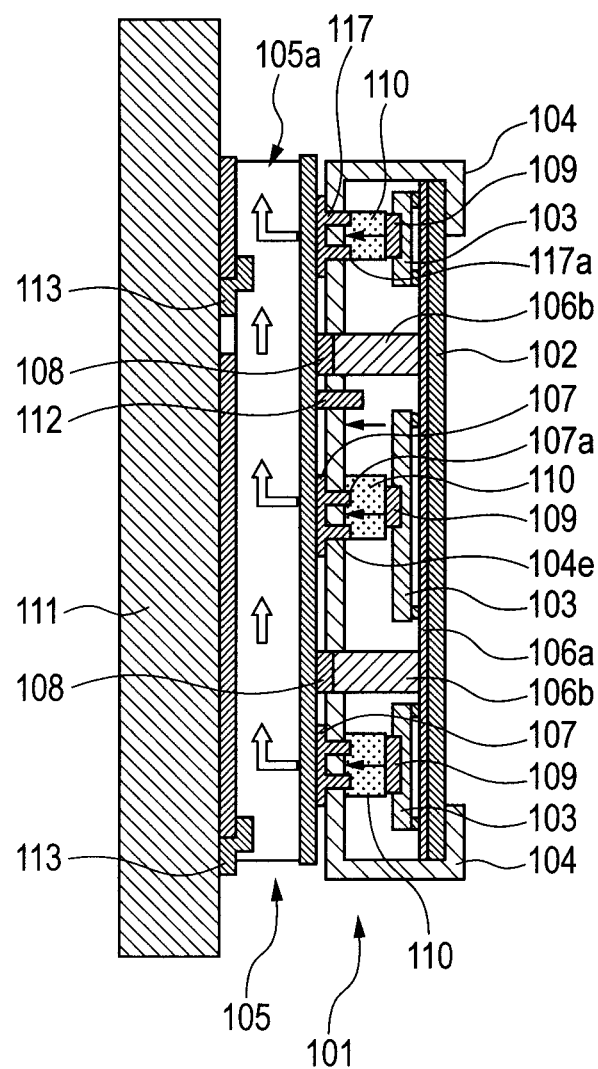
FIG. 7 is a sectional side view illustrating an image displaying apparatus and a holding constitution thereof according to a fourth embodiment.

As for an image displaying apparatus 101 according to the fourth embodiment, the constitution of heat-transfer members is different from that of the first embodiment. And, also in a point that an opening/closing unit is not required to be provided, it is different from a case in the first embodiment. When referring to FIG. 7, the heat generating members 109 are connected to the cabinet 104 through first heat conductive members 110, and plural small apertures 104e are provided at the cabinet 104. A second heat conductive member 117 has plural projections 117a, and the plural apertures 104e are provided for each the second heat conductive member 117 so as to take in the respective projections 117a.

When the holding member 105 is mounted to the image displaying apparatus 101, the second heat conductive member 117 is thermally connected to the heat generating member 109 through the first heat conductive member 110. The projections 117a of the second heat conductive member 117 are extended and may be directly contacted to the heat generating member 109. Although it is not illustrated, caps similar to those of the first embodiment can be also provided. Since the large apertures 104a are not formed, even if the caps are not provided, an exterior appearance is not very complicated. In the present embodiment, although a thermal contact area is slightly decreased, in a case that sufficient heat radiation efficiency is obtained, the constitution can be simplified as compare with a case of using the door members 114b or the plate 114c, therefore, the cost can be reduced.

While the present invention has been described with reference to the exemplary embodiments, it is to be understood that the invention is not limited to the disclosed exemplary embodiments The scope of the following claims is to be accorded the broadest interpretation so as to encompass all such modifications and equivalent structures and functions.

This application claims the benefit of Japanese Patent Application No. 2010-138323, filed Jun. 17, 2010, which is hereby incorporated by reference herein in its entirety.

What is claimed is:

1. An image displaying apparatus comprising:
   a display panel configured to display an image on a display surface;
   a heat generating member provided on a back side being an opposite side of the display surface of the display panel;
   a cabinet configured to cover the display panel and the heat generating member at least from the back side of the display panel, wherein, in the cabinet, an aperture is provided at a position facing the heat generating member; and
   an opening/closing unit configured to enable switching between closing and opening of the aperture,
   wherein, in a state that the aperture is opened by the opening/closing unit and one part of a heat-transfer member is positioned on a side of the cabinet opposite to the display panel, another part of the heat-transfer member extends through the aperture so that the heat-transfer member can thermally be connected to the heat generating member.

2. The image displaying apparatus according to claim 1, wherein
   the image displaying apparatus comprises a plurality of heat generating members,
   the cabinet has a plurality of apertures,
   the heat-transfer member has a plurality of projections, and
   each of the projections of the heat-transfer member extends through the plural apertures so that each of the plural projections can thermally be connected to the heat generating members.

3. The image displaying apparatus according to claim 1, wherein
   the opening/closing unit has a door member provided on a display panel side of the cabinet and has an elastic restoring force operating to close the aperture, and
   when the door member is pressed by the heat-transfer member from the side of the cabinet opposite to the display panel, the door member opens the aperture so that the another part of the heat-transfer member extends through the aperture.

4. The image displaying apparatus according to claim 1, wherein the opening/closing unit has a plate provided on a display panel side of the cabinet and capable of sliding along the cabinet between a first position for closing the aperture and a second position for opening the aperture.

5. The image displaying apparatus according to claim 4, wherein
   the opening/closing unit has a fulcrum which is provided on the display panel side of the cabinet and an arm which is mounted so as to be able to rotate around the fulcrum and of which one end is coupled to the plate, and
   the arm causes the plate to slide between the first position and the second position by rotating around the fulcrum.

6. The image displaying apparatus according to claim 1, wherein the cabinet has an air communication hole of which an aperture area is smaller than an area of the aperture.

7. The image displaying apparatus according to claim 1, further comprising a holding member, with the holding member including:
   a first portion fixed to a wall; and
   a second portion fixed to the image displaying apparatus, wherein an airflow path through which air can flow is formed between the first portion and the second portion, and
   the second portion is the heat-transfer member of the image displaying apparatus.

8. The image displaying apparatus according to claim 2, further comprising a holding member, with the holding member including:
   a first portion fixed to a wall; and
   a second portion fixed to the image displaying apparatus, wherein an airflow path through which air can flow is formed between the first portion and the second portion,
   the second portion is the heat-transfer member of the image displaying apparatus,
   the second portion has the plurality of projections projecting toward an opposite side of the first portion, and
   each of the projections extends through the plural apertures so that the projections can thermally be connected to the heat generating members.

9. The holding member according to claim 7, wherein the second portion has a radiation fin on an airflow path side.

10. An image displaying system which comprises an image displaying apparatus and a holding member fixed to the image displaying apparatus, wherein:
    the image displaying apparatus comprises
       a display panel configured to display an image on a display surface,
       a heat generating member provided on a back side being an opposite side of the display surface of the display panel, and
       a cabinet configured to cover the display panel and the heat generating member at least from the back side of the display panel, wherein, in the cabinet, an aperture is provided at a position facing the heat generating member; and
    the holding member comprises
       a first portion fixed to a wall, and
       a second portion made by a heat-transfer member,
       wherein an airflow path through which air can flow is formed between the first portion and the second portion,
    the second portion of the holding member is fixed to the image displaying apparatus, and
    in a state that one part of the heat-transfer member is positioned on a side of the cabinet opposite to the display panel, another part of the heat-transfer member extends through the aperture so that the heat-transfer member is thermally connected to the heat generating member.

11. The image displaying system according to claim 10, wherein
    the image displaying apparatus comprises an opening/closing unit configured to switch between closing and opening of the aperture, and
    the opening/closing unit opens the aperture.

12. The image displaying system according to claim 11, wherein
    the opening/closing unit has a door member provided on a display panel side of the cabinet and has an elastic restoring force operating to close the aperture, and
    the door member opens the aperture when the door member is pressed by the heat-transfer member.

13. The image displaying system according to claim 11, wherein
    the opening/closing unit has a plate mounted on the display panel side of the cabinet and capable of sliding along the cabinet between a first position for closing the aperture and a second position for opening the aperture, and
    the plate is in the second position.

14. An image displaying system comprising:
    the image displaying apparatus described in claim 1; and
    a stand which can be set up on a horizontal surface and is mounted to the image displaying apparatus,
    wherein the opening/closing unit is closing the aperture.

* * * * *